April 1, 1969 F. R. FLUHR 3,436,689

FIELD EFFECT DELAY LINE

Filed Nov. 2, 1964 Sheet 1 of 2

INVENTOR
FREDERICK R. FLUHR

BY [signature]
ATTORNEY

INVENTOR

FREDERICK R. FLUHR

BY [signature]

ATTORNEY

United States Patent Office 3,436,689
Patented Apr. 1, 1969

3,436,689
FIELD EFFECT DELAY LINE

Frederick R. Fluhr, Fort Foote Village, Md., assignor to the United States of America as represented by the Secretary of the Navy Filed Nov. 2, 1964, Ser. No. 408,441
Int. Cl. H01l 15/00; H03k 3/26
U.S. Cl. 333—31 1 Claim

ABSTRACT OF THE DISCLOSURE

A field effect variable delay line formed from a solid cylinder of semiconductor material of one type of conductivity surrounded by a helix of semiconductor material of the opposite type. A distributed P-N junction is thus formed with means for reverse biasing said P-N junction by applying a back voltage between said helix and an electrode on an end surface of the cylinder.

The invention described herein may be manufactured and used by or for the Government of the United States of America for governmental purposes without the payment of any royalties thereon or therefor.

This invention relates to a delay line and in particular to a delay line comprising a P-N (or N-P) junction formed on a semiconductor in a spiral form.

Prior art delay lines have not proven satisfactory in the field of microelectronic circuits where size and power must be minimized. Also, the delay of conventional coil-type delay lines cannot be controlled by varying a voltage remotely. In the field of microelectronic circuitry, very small passive delay lines having a very short voltage-controllable delay are often needed.

The general purpose of this invention is to provide a delay line which embraces all the advantages of prior art delay lines and which can be suitably employed in microelectronic circuitry. To attain this, the present invention provides a semiconductor delay line having a very short voltage variable delay wherein a unique semiconductor arrangement forms a helical P-N (or N-P) junction.

An object of the present invention is the provision of a semiconductor delay line.

Another object is to provide a delay line having a helical P-N (or N-P) junction whose delay can be varied remotely.

A further object is to provide a delay line having a very short voltage-variable delay.

Other objects and many of the attendant advantages of this invention will be readily appreciated as the same becomes better understood by reference to the following detailed description when considered in connection with the accompanying drawings in which like references numerals designate like parts throughout the figures thereof and wherein.

Figure 1:
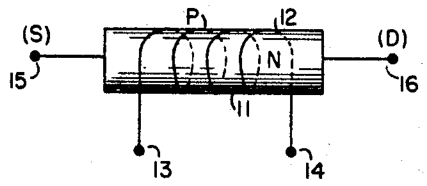
FIG. 1 is a plan view of the semiconductor delay line of the present invention.

Referring now to the drawings, there is shown in FIG. 1, which illustrates an embodiment of the invention, a body 11 comprising a cylindrical length or portion of N-type semiconductor material. A length of P-type material 12 is helically formed about the N-type body 11 along its length. One end of the length of P-type material 12 has a gate input terminal 13 and the other end of the length 12 has a gate output terminal 14. Also shown in FIG. 1 are source terminal 15 and drain terminal 16 which may be omitted in certain applications if desired. The body 11 is shown as N-type semiconductor but could also be made of P-type semiconductor provided that helix 12 is made of N-type semiconductor.

In operation, the P-N (or N-P) junction forms a non-linear capacitance between the control lead (gate) and the semiconductor. If this P-N (or N-P) junction is placed on the semiconductor in a helical fashion shown in FIG. 1, the result is a voltage-controllable variable delay line of short delay, the delay being controllable by the voltage applied to terminal 15.

The helical form is electrically similar to a coil and the P-N (or N-P) junction provides the distributed capacitance. The delay line has a very short delay which is voltage-variable since the distributed capacitance of the P-N (or N-P) junction is voltage sensitive. The capacitance of such a P-N (or N-P) junction is proportional to $1/V^{1/n}$, where $n$ is equal to a value between 2 and 3 and V is the value of the bias voltage applied to the P-N (or N-P) junction by terminals 13 and 15. The relay per unit length of such line is proportional to $\sqrt{LC}$, where L is the inductance per unit length and C is the capacitance per unit length. If additional delay is desired, the unit can be covered with a permeable magnetic material such as a ferrite or permalloy. This will increase the inductance together with the total time delay.

Figure 2:
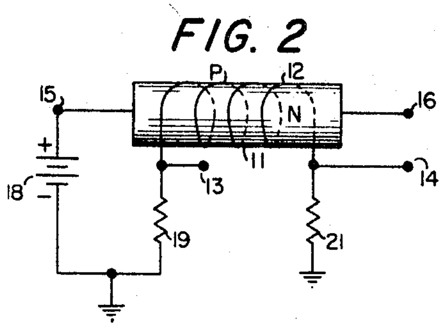
FIG. 2 is a plan view and schematic circuit diagram of a biased semiconductor delay line of the present invention.

FIG. 2 illustrates the biased delay line with P-type material 12 helically formed about a body 11 of N-type semiconductor to form a helical P-N (or N-P) junction having an input terminal 13 and an output terminal 14. A voltage source 18 is shown connected between the source terminal 15 and ground for back-biasing the P-N (or N-P) junction. An input terminating resistor 19 is connected between input terminal 13 and ground, and an output terminating resistor 21 is connected between output terminal 14 and ground. Drain connection 16 is shown in both FIGS. 1 and 2 but is not employed in these configurations. Body 11 of FIG. 2 may, of course, be P-type semiconductor provided that helix 12 is N-type semiconductor.

Figure 3:
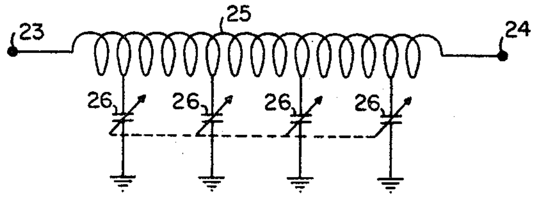
FIG. 3 is a circuit diagram of the equivalent circuit for the delay line of this invention.

The equivalent circuit for the delay line of FIGS. 1 and 2 is shown in FIG. 3 having an inductance 25 and a variable distributed capacitance 26 together with input terminal 23 and output terminal 24. The inductance 25 is related to the electrical coil behavior of helix 12 and the variable capacitance 26 is related to the voltage variable capacitance of the P-N (or N-P) junction.

The P-N (or N-P) junction of this invention can be made by means of known manufacturing techniques such as diffusion or alloy processes. In order to make a low loss device, the helix 12 can be plated with a low loss conductor to decrease resistance.

Figure 4:
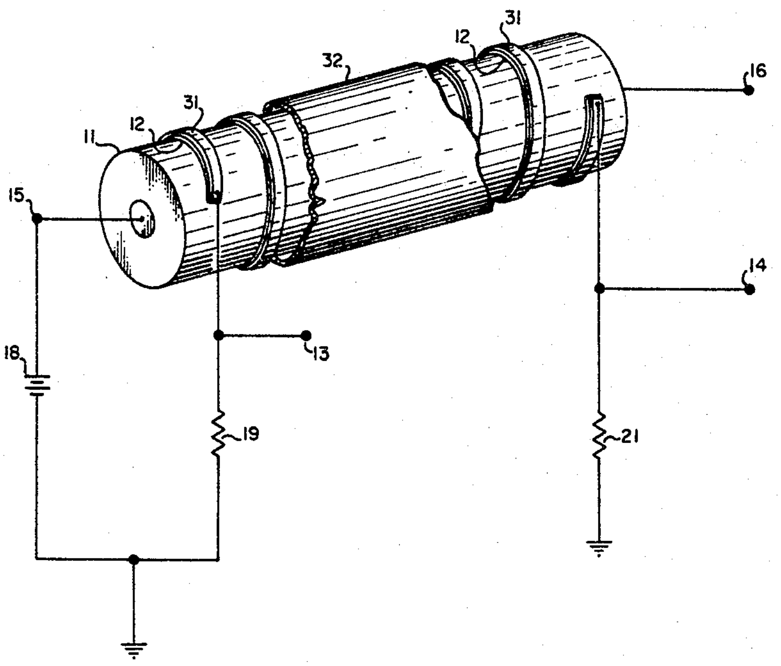
FIG. 4 is a partially cutaway view and schematic circuit diagram of a biased semiconductor delay line according to the present invention.

FIG. 4 shows a partially cutaway view of a biased semiconductor delay line according to the present invention. The unit is shown covered with a permeable magnetic material 32 which has been partially cutaway for illustration purposes. This material increases the inductance and time delay of the unit. Helix 12 is also shown plated with a low loss conductor 31 to decrease resistance.

As can be derived from the above description, this invention provides a novel semiconductor device whose size and power requirements are suitable for microelectronic applications. This semiconductor device provides a short delay which can be remotely controlled by varying a biasing voltage.

Obviously many modifications and variations of the present invention are possible in the light of the above teachings. It is therefore to be understood, that within the scope of the appended claim, the invention may be practiced otherwise than as specifically described.

What is claimed and desired to be secured by Letters Patent of the United States is:

1. A field effect variable delay line comprising:
   - an elongated, solid, circular cylinder of semiconductor material of one type of conductivity; said cylinder having two parallel end surfaces perpendicular to the axis of said circular cylinder;
   - a helix of semiconductor material of the opposite type of conductivity located on the cylindrical surface of said cylinder to form a helical P-N junction, wherein the helix provides distributed inductance and the P-N junction provides distributed capacitance, one end of said helix of semiconductor material being the input terminal of said delay line and the other end of said helix being the output terminal of said delay line;
   - a coating of conductive material plated on said helix of semiconductor material;
   - a cover of permeable magnetic material surrounding the unit comprising said cylinder and said helix;

- a source electrode on one of said two parallel end surfaces;
   - a drain electrode on the other of said two parallel end surfaces; and
   - a voltage source coupled between said input terminal on said cylindrical surface and said source electrode on said end surface to nonuniformly reverse bias said helical P-N junction.

References Cited

UNITED STATES PATENTS

| | | | |
|---|---|---|---|
| 3,070,762 | 12/1962 | Evans | 333—70 |
| 3,022,472 | 2/1962 | Tannenbaum | 333—18 |
| 3,089,108 | 5/1963 | Gong et al. | 338—2 |
| 3,212,032 | 10/1965 | Kaufman. | |
| 3,321,738 | 5/1967 | Trott | 340—10 |

ELI LIEBERMAN, *Primary Examiner.*

C. BARAFF, *Assistant Examiner.*

U.S. Cl. X.R.

307—293, 320; 317—235